United States Patent
Werne et al.

(10) Patent No.: US 8,546,807 B2
(45) Date of Patent: Oct. 1, 2013

(54) OFF-SET TOP PIXEL ELECTRODE CONFIGURATION

(75) Inventors: Tim Von Werne, London (GB); Kieran Reynolds, Histon (GB); Boon Hean Pui, Cambridge (GB)

(73) Assignee: Plastic Logic Limited (GB)

( * ) Notice: Subject to any disclaimer, the term of this patent is extended or adjusted under 35 U.S.C. 154(b) by 219 days.

(21) Appl. No.: 12/990,198

(22) PCT Filed: Apr. 27, 2009

(86) PCT No.: PCT/GB2009/050423
§ 371 (c)(1),
(2), (4) Date: Jan. 14, 2011

(87) PCT Pub. No.: WO2009/133388
PCT Pub. Date: Nov. 5, 2009

(65) Prior Publication Data
US 2011/0101361 A1  May 5, 2011

(30) Foreign Application Priority Data

Apr. 28, 2008 (GB) .................................. 0807767.9
Feb. 9, 2009 (GB) .................................. 0901970.4

(51) Int. Cl.
*H01L 51/52* (2006.01)
*H01L 51/56* (2006.01)

(52) U.S. Cl.
USPC .......... 257/59; 257/E51.018; 349/33; 349/38; 349/39

(58) Field of Classification Search
USPC .................. 257/59, E51.018; 349/33, 38, 39
See application file for complete search history.

(56) References Cited

U.S. PATENT DOCUMENTS

| 8,183,571 B2* | 5/2012 | Yamazaki et al. ............... 257/72 |
| 8,184,219 B2* | 5/2012 | Luo et al. ......................... 349/38 |
| 2002/0110941 A1 | 8/2002 | Yamazaki et al. |
| 2007/0291195 A1 | 12/2007 | Kim et al. |
| 2008/0164463 A1 | 7/2008 | Kawashima et al. |

FOREIGN PATENT DOCUMENTS

| EP | 1 310 997 | 5/2003 |
| JP | 2000-196094 A | 7/2000 |
| JP | 2007-073563 A | 3/2007 |
| JP | 2007-311377 A | 11/2007 |
| JP | 2008-083731 A | 4/2008 |
| WO | WO 2006/059162 | 6/2006 |

OTHER PUBLICATIONS

International Preliminary Report on Patentability for Application No. PCT/GB2009/050423 dated Nov. 11, 2010 in 5 pages.
English translation of Japanese Office Action, issued in Patent Application No. JP 2011-506778, dated Jul. 2, 2013.

\* cited by examiner

*Primary Examiner* — Matthew W Such
*Assistant Examiner* — David Spalla
(74) *Attorney, Agent, or Firm* — Knobbe Martens Olson & Bear LLP

(57) ABSTRACT

A semiconductor device architecture where the top pixel electrode is deposited in an off-set configuration, such as to overlap the COM electrode, and also the gate electrode of the neighboring device.

20 Claims, 7 Drawing Sheets

US 8,546,807 B2

OFF-SET TOP PIXEL ELECTRODE CONFIGURATION

CROSS-REFERENCE TO RELATED APPLICATIONS

This application is the U.S. National Phase under 35 U.S.C. §371 of International Application No. PCT/GB2009/050423, filed Apr. 27, 2009, designating the United States and published in English on date Nov. 5, 2009, as WO 2009/133388, which claims priority to United Kingdom Application No. 0807767.9, filed Apr. 29, 2008 and United Kingdom Application No. 0901970.4, filed Feb. 9, 2009.

FIELD OF THE INVENTION

The present invention relates to an electronic device incorporating an off-set pixel electrode; in particular a multi-layer transistor device incorporating an off-set pixel electrode.

BACKGROUND OF THE INVENTION

In accordance with the prior art, multi-layer active matrix displays are well known. Conventional thin film transistors (TFT) are typically fabricated with inorganic silicon, such as amorphous silicon or polycrystalline silicon. Silicon based processes require a combination of vacuum deposition and subtractive photolithographic patterning steps leading to high capital equipment, materials and manufacturing costs. The most common active matrix display technology is the thin film transistor liquid crystal display (LCD), where applications range from PDA and notebook devices to flat screen televisions. Active matrix displays are also used in combination with emerging display effects such as organic light emitting diodes (OLED) and electronic paper. In many conventional pixel configurations the presence of the pixel capacitor reduces the aperture ratio.

Active matrix displays, where the pixel voltage or current is controlled by one or more transistors, dominate flat panel display design. One of the key elements of an active matrix display pixel is the pixel capacitor, formed between each of the pixel electrodes and an interconnect line at a fixed potential. The interconnect line can be a separate metallic line held at a fixed potential (usually ground potential) during the addressing of the active matrix, or it can be the (N−1)th or (N+1)th neighbouring TFT gate addressing line, that is kept at a fixed potential while the Nth gate addressing line is being addressed. This configuration is most common because it does not require a third additional set of interconnect lines running across the display, as would be the case where there is a separate bus line.

The manufacture of active matrix displays by solution based print processes offers many potential advantages over conventional manufacturing methods. In principle, solution based print processes are environmentally friendly, low temperature, compatible with flexible substrates, cost effective and advantageous for short run length and large display sizes. However, fabrication of high-resolution displays by printing processes is challenging. When using printing processes such as additive inkjet printing, screen printing and offset printing or subtractive direct-write patterning processes laser ablation it is difficult to fabricate metallic interconnect lines with a width of less than 50-100 μm because of the difficulties associated with delivering small volumes of liquid. Furthermore, many printable conductors such as conducting polymers or colloidal metals have conductivities significantly lower than bulk copper or silver, therefore requiring thick and wide interconnect lines to achieve adequate conductance across a large active matrix. Therefore, by using conventional display architectures, printed components can tend to be large and result in active matrix displays with low aperture ratios. FIG. 2 shows a known multi-layer structure with a continuous top pixel electrode deposited over the gate electrode.

One problem that is shared between conventional TFT technology and semiconducting polymer-based printed TFTs alike is the limited display area, in which the thin film transistor, the gate line, the pixel capacitor and the pixel itself compete with each other for space. This can lead to a reduction in the aperture ratio and therefore the quality of the display. The aperture ratio of the display is defined by the area of the pixel electrode divided by the area of the pixel footprint. Since the pixel electrode is competing for space in the pixel footprint, it is preferable to use a multi-level structure where the pixel electrode is defined on a different layer from the interconnect and data lines. When fabricating such an electrode it is advantageous to use an organic conductor because it can be processed from solution, which facilitates the process of via-hole filling and allows for low cost deposition techniques. A schematic of a prior art architecture is shown in FIGS. 1 to 3.

In our patent application PCT/GB2006/050078 a four or five layer architecture structure is disclosed where the pixel capacitor can be formed with one of the two electrodes of a pixel capacitor being quasi-continuous. In such a case, the pixel capacitance becomes largely insensitive to the detailed position of the other of the electrode. This can be achieved, for example, by running a straight common electrode (COM) line with a given line width smaller than the pixel pitch behind the pixel electrode. The correct pixel capacitance can be tuned by the capacitance (thickness and dielectric constant of the pixel capacitor dielectric 8). Even for a wide linewidth a small pixel capacitance can be achieved if needed by choosing a relatively thick pixel dielectric. In this structure the value of the pixel capacitance is independent of the exact location of the COM line behind the pixel electrode, as long as the COM line is fully running below the pixel electrode, and does not begin to overlap with the neighbouring pixel electrode. By choosing an appropriately thick dielectric between the COM line and the TFT layers, any contribution to the pixel capacitance from overlap of the COM line with the drain electrode of the TFT in the first layer is negligible. This leads to a highly uniform value of the pixel capacitance across the pixel array, which is an important requirement for grey scale displays.

The object of the present invention relates to an electronic device incorporating an off-set pixel electrode achieving increased storage capacitance.

SUMMARY OF THE INVENTION

According to a first aspect of this invention there is therefore provided a multilayer electronic structure comprising a substrate bearing at least three conducting layers, adjacent ones of said conducting layers being separated by a dielectric layer, a first one of said conducting layers defining drain and source electrodes of a thin film transistor (TFT) for driving a pixel of an active matrix optoelectronics device, an intermediate second one of said conducting layers defining a gate electrode of said transistor and a first plate of a capacitor for storing charge to maintain an electrical state of said active matrix pixel, and a third one of said conducting layers defining a second plate of said capacitor, wherein said second plate is laterally positioned such that it is offset in a vertical direction from said gate electrode and such that it overlaps in a vertical direction with said first plate and at least a gate electrode of a thin film transistor for driving a neighbouring pixel of the active matrix optoelectronics device.

In embodiments arranging the second plate of the capacitor in an off-set configuration so as to overlap the first plate (COM electrode) of the capacitor and also the gate electrode of the neighbouring device allows for improved device performance. This results from a decrease in the contribution made to the parasitic capacitance between the top pixel electrode and the gate electrode, allowing for reduction of the top pixel dielectric thickness with concomitant increase in storage capacitance. This has an advantageous effect of enabling an overall increase in the ratio of storage capacitance to parasitic capacitance and thereby reducing kick-back voltage from low on-current TFT's driving e-paper media.

Preferably the structure includes a via connecting the drain electrode to the second plate of the capacitor for charging when the TFT is activated. In a preferred embodiment, the via is connected to the drain by means of a drain pad coupled thereto, and in particular as centrally as possible and away from the edges. In this way, the risk of inadvertently positioning the via hole partly or fully off of the drain pad during fabrication is reduced. The conducting layer which is not to be connected to this via (the layer defining the gate electrode and first plate of the capacitor) may be patterned to avoid the via, preferably so that the via pass through the first plate of the capacitor.

In some preferred embodiments the gate dielectric layer comprises multiple dielectric layers, for example a double layer structure comprising a lower dielectric constant layer at an interface of the semiconductor layer and a subsequent higher dielectric constant layer. Preferably at least some of the layers comprise organic, in particular polymer material such as polymer semiconducting and/or conducting material (here references to organic materials include organometallic materials).

When incorporated into a pixel drive structure of an active matrix display of an active matrix display preferably the first plate forms a common bus line of the display, for example an interconnect line to be held at a fixed potential such as ground or an address line such as the gate addressing line of a neighbouring thin film transistor. Preferably the second plate of the capacitor forms a pixel drive electrode for applying voltage/current to the electroluminescent material. This structure helps to provide an enhanced aperture ratio and also provides some alignment tolerance between the various layers of the structure.

Plural pixel drive structures may form an active matrix display, in which lines of pixel drive structures are alternated with source lines that provide display signal data, and in which the second plate of the capacitor of a pixel drive structure overlaps the gate electrode of a thin film transistor of the neighbouring pixel drive structure in a given line. The second plate of a line of pixel drive structures may overlap with an adjacent source line thereby providing some further alignment tolerance between the various layers of the structure, and eases the fabrication process of the display.

In a related aspect of there invention there is provided a method of fabricating a multilayer electronic structure on a substrate, the method comprising: depositing and patterning a first conducting layer over said substrate to define source and drain electrodes of a thin film transistor for driving a pixel of an active matrix optoelectronics device; depositing an organic semiconducting layer over said first conducting layer; depositing a first dielectric layer over said organic semiconducting layer; depositing and patterning a first portion of a second conducting layer over said first dielectric layer to define a gate electrode of said thin film transistor; depositing and patterning a second portion of said second conducting layer substantially coplanar to said first portion to define a first plate of a capacitor for storing charge to maintain an electrical state of said active matrix pixel; depositing a second dielectric layer over said second conducting layer; depositing and patterning a third conducting layer over said second dielectric layer to define a second plate of said capacitor; wherein said second plate is laterally positioned such that it is offset in a vertical direction from said gate electrode and such that it overlaps in a vertical direction with said first plate and at least a gate electrode of a thin film transistor for driving a neighbouring pixel of the active matrix optoelectronics device.

The layers may be deposited using solution processing techniques such as spin coating and inkjet printing, though alternatively one or more of the layers may be deposited by evaporation or sputtering processes. There is further provided a method of fabricating an active matrix display by using the above method to fabricate a driver structure for substantially each of the pixels.

BRIEF DESCRIPTION OF THE DRAWINGS

To help understanding of the invention, a specific embodiment thereof will now be described by way of example and with reference to the accompanying drawings, in which.

DETAILED DESCRIPTION OF PREFERRED EMBODIMENTS

Figure 4:
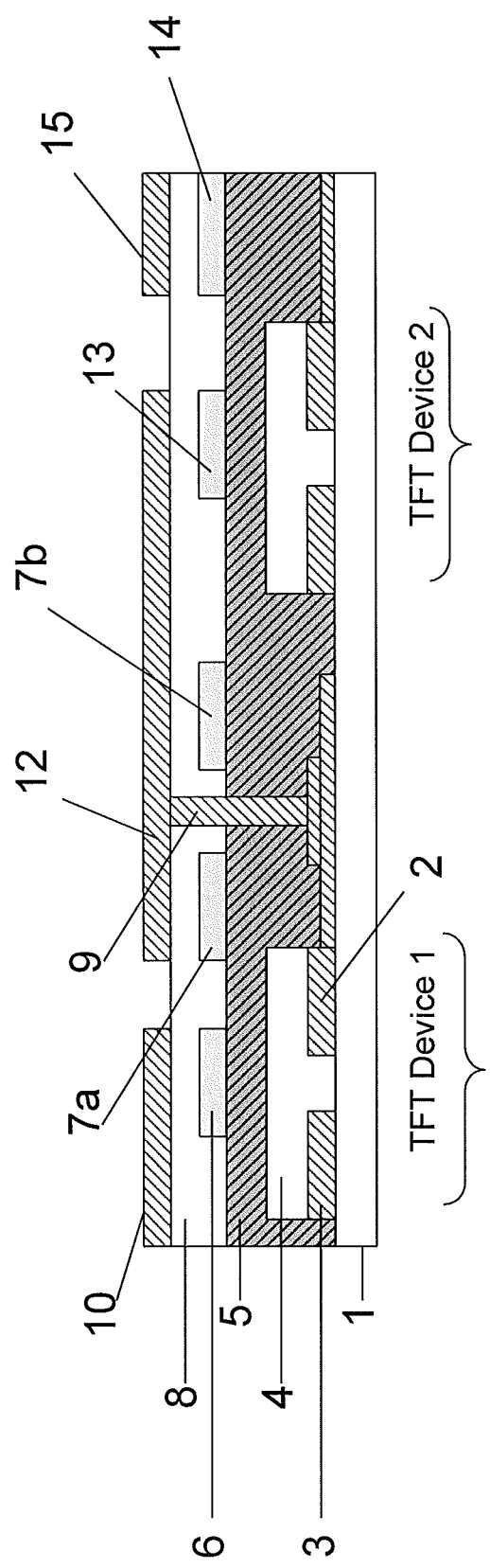
FIG. 4 illustrates a side view schematic of an architecture incorporating an embodiment of a multilayer electronic structure including an off-set top pixel electrode according to the invention, and also detailing a neighbouring transistor device.

With reference to FIG. 4, a first embodiment of the present invention is now described in detail. A substrate 1 is coated with a thin layer of conductive material. The substrate may be either glass or a polymer film. According to a preferred embodiment of the invention the substrate is a plastic substrate, such as a film of polyethyleneterephtalate (PET) or polyethylenenaphtalene (PEN). A first conductive layer 2, 3 is preferably a metallic layer and most preferably a layer of an inorganic metal, such as gold, which adheres well to the substrate and is electrically compatible with the chosen semiconductor or any combination of metals to achieve these effects. A bilayer structure may be deposited, including a seed or adhesion layer in between the layer of metallic material and the substrate. Alternatively, a conductive polymer may be used, such as PEDOT/PSS. The conductive material is preferably deposited using solution processing techniques such as, but not limited to spin, dip, blade, bar, slot-die, or spray coating, inkjet, gravure, offset or screen printing. A technique, such as, but not limited to an evaporation or sputtering process may also be used to deposit a metallic layer. The first conductive layer is generally patterned and may form, for example, the source and drain electrodes 2, 3 or the gate electrode (in the case of a bottom gate device) of a transistor device. The patterning may be achieved by a process such as, but not limited to, photolithography, laser ablation or direct-write printing. Other processes that may be used include shadow mask evaporation or other printing and etching methods. Subsequently a sequence of further conducting, dielectric and semiconducting layers is deposited on top of the first conductive layer.

For example, in the case of a transistor device in top-gate configuration, once the metallic layer has been patterned to form source and drain electrodes 2, 3 a layer of semiconducting material 4 is deposited over the substrate. The semiconducting material may be a semiconducting polymer such as a polytriarylamine, polyfluorene or polythiophene derivative. A broad range of printing techniques may be used to deposit the semiconducting material including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, blade coating or dip coating, curtain coating, meniscus coating, spray coating, or extrusion coating, spin-coating onto the substrate. The typical thickness of the semiconducting layer is on the order of 50-100 nm after solvent evaporation. In addition, an evaporative process may also be used. A preferred technique is ink jet printing which can also pattern the semiconducting layer. If the layer is ink jet printed, a minimum amount of semiconductor material may be used, which is both environmentally and economically advantageous. Preferably the semiconductor layer is patterned in order to prevent leakage current between adjacent devices.

A layer of gate dielectric material 5 or a sequence of dielectric layers may then be deposited on top of the semiconducting layer. Materials such as polyisobutylene, polymethylmethacrylate, polystyrene or polyvinylphenol may be used. The dielectric material may be deposited in the form of a continuous layer, by techniques such as, but not limited to, spray or blade coating. However, preferably, the technique of spin coating is used. The typical thickness of the gate dielectric layer is between 150-1000 nm. The semiconductor layer/dielectric layer interface defines the device performance. The dielectric may either be a single layer or a sequence of multiple layers. According to one embodiment of the present invention the dielectric is a double-layer with a low-k dielectric in contact with the semiconducting layer, and a high-k material deposited on top. In addition, the dielectric layer(s) need to be chosen such as to allow the gate interconnect line to be deposited on top of the dielectric layer(s) with ease. This can be achieved by depositing a further dielectric layer on top of the high-k dielectric material acting as a wetting layer.

The deposition of the layer of dielectric material is then followed by the deposition of a gate interconnect line 6, 14. The gate interconnect line may comprise a conducting polymer, such as polyethylenedioxythiophene doped with polystyrene sulfonic acid (PEDOT/PSS). However, the gate electrode is preferably a metallic material of high conductivity, such as gold or copper, but most preferably, a printable liquid containing inorganic nanoparticles of silver or gold, which may be deposited by a variety of means. The gate electrode is deposited and patterned using techniques such as sputtering, photolithography, or laser patterning or deposited and patterned by solution processing techniques such as spin, dip, blade, bar, slot-die, gravure, offset or screen printing. Preferably, the gate electrode is deposited by ink jet printing. A gate electrode wetting layer, such as a layer of polyvinylphenol, may be deposited onto the substrate prior to the printing of the metal ink.

The conductivity of the gate interconnect line 6 should be sufficiently high to drive the display. The deposited gate interconnect lines created by this process are generally required to undergo an annealing process to improve the conductivity or convert non-conductive inks to a conductive state. This annealing process is preferably carried out with an IR laser beam. However, depending on the ink that is used for the conductive layer, ultraviolet radiation or thermal annealing may also be used.

As illustrated in FIG. 4, a common electrode (COM) 7, 14 is deposited in a co-planar relationship to the gate electrode. This electrically conductive layer should exhibit sufficient conductivity to compensate for any swings in voltage as the gate interconnect line is switched. A desirable requirement is the avoidance of the via hole 9 area in the pixel electrode region, such as a via hole of approximately 15 μm in diameter (depending on the via hole interconnect forming process used) for a 250 μm by 250 μm pixel within a ~100 ppi display. A further desirable requirement for the deposition of the common electrode is the avoidance of the gate line.

A top dielectric layer 8 is then added to the layered stack as is shown in FIG. 4. Preferably, the top dielectric layer is an organic dielectric material or a layer of organic-inorganic hybrid dielectric material. The layer of dielectric material may, for example, be a layer of chemical vapour deposited parylene. Alternatively, a number of layers of dielectric material may be deposited at this stage, including layers of material such as solution coated polystyrene or PMMA. These layers of dielectric material may be deposited by any large area coating method, such as, but not limited to, spin coating, spray coating, or blade coating. The thickness of the layer is preferably in the range of 0.1-20 μm and most preferably in the range of 2 to 5 μm.

This layer(s) provides electrical isolation to prevent the COM layer and the co-planar gate interconnect lines shorting to above top electrode. This top dielectric layer(s) should be thick enough to reduce any capacitive coupling between the gate interconnect line/the top pixel electrode to the top pixel electrode, or provide a suitable dielectric constant. The material of the dielectric layer may be modified to allow patterning by methods such as adding an IR absorbing chemical moiety to the material followed by laser ablation of the material. The dielectric layer may also be tuned or chosen such that it possesses adhesive properties that allow ready deposition of the overlying electrode layer and further allow the COM layer to stick to the underlying layers.

As further illustrated in FIG. 4, a via hole 9 is then formed through the layers of the device to connect the top layer of conductive material with a conductive via pad on the first layer of the device, therefore connecting the upper layer high aperture ratio pixel to the underlying drain electrode of the transistor. This connection allows the top pixel electrode to charge when the TFT is activated. The via hole is preferably formed using an excimer laser to drill through underlying polymer layers. However, other methods of forming the via hole known in the prior art include mechanically punching a via hole through the underlying layers or the method local solvent deposition (see for example our patent application PCT/GB00/04942).

Figure 2:
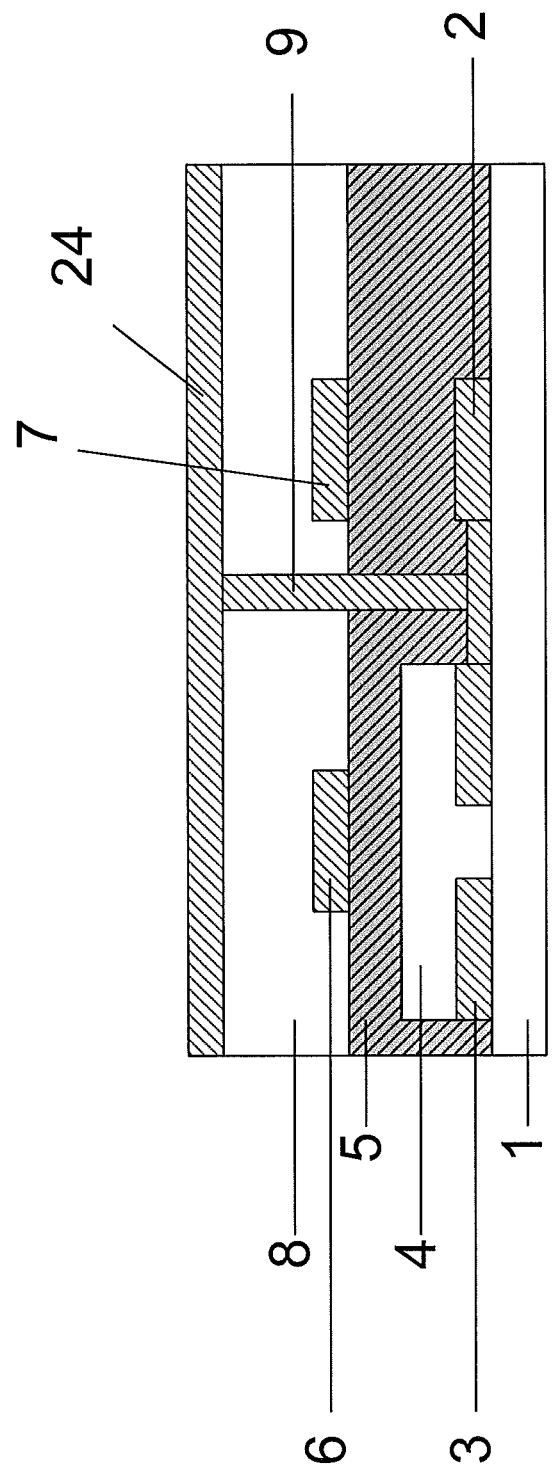
FIG. 2 shows a side view schematic of an architecture of a continuous top pixel electrode of the prior art without being off-set, that is the top pixel electrode overlapping the gate electrode.
Figure 3:
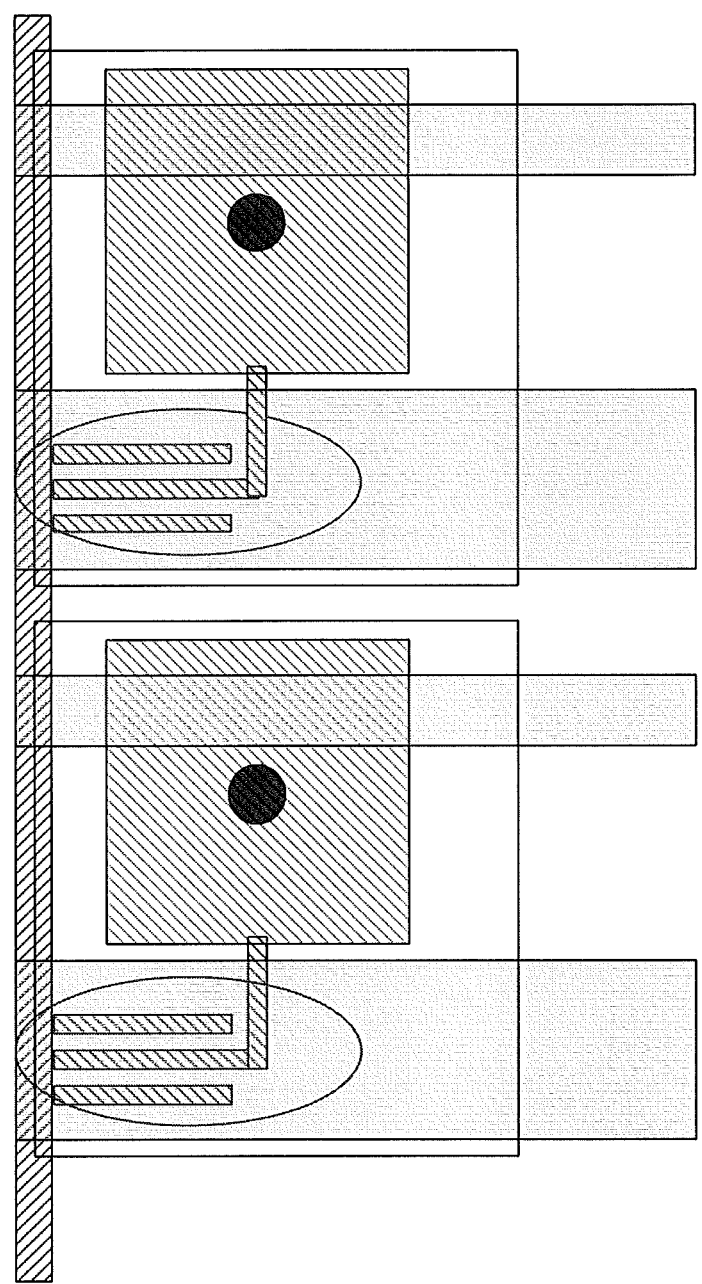
FIG. 3 shows a top view schematic of the architecture of a continuous top pixel electrode of the prior art without being off-set, that is, the top pixel electrode simultaneously overlapping both the gate electrode and the common electrode of the device being addressed.

In the prior art, the top pixel electrode is then deposited as is shown in FIG. 2, such as to overlap the gate electrode and the COM electrode. A thick pixel dielectric layer 8 is required for this configuration due to the detrimental drain-gate capacitance ($C_{dg}$).

However, in the present invention, the top pixel electrode is deposited in an off-set configuration, such as to overlap the COM electrode of the present device, but also the gate electrode of the neighbouring device, as is outlined below and depicted in FIGS. 4 and 5. In order to obtain an increased storage capacitance value, it is advantageous for the top pixel electrode to overlap with the COM electrode, but not with the gate electrode of the device being driven. Therefore, the top pixel electrode overlaps with the gate electrode of the neighbouring device, in order to maximize the storage capacitance value and minimize the gate electrode to drain electrode overlap capacitance. Therefore, in the present case, the top conductive layer of the device is finally deposited over the underlying multi-stack, in the form of the top pixel electrode layer 10, 12 & 15.

EXAMPLE 1

Offset Pixel Electrode to Produce an Overlap Between the Top Pixel Electrode and the Underlying COM Electrode & Neighbouring Gate Electrode, in Order to Increase Storage Capacitance It is an aim of the present invention to provide a thin film transistor device incorporating an architecture resulting in a high aperture ratio and, preferably, allowing for good pixel capacitance, and low $C_{dg}$ (i.e. kick-back voltage). Exemplary architectures of a multilayer electronic structure and pixel drive structures can be seen in FIGS. 4 and 5 respectively.

Figure 1:
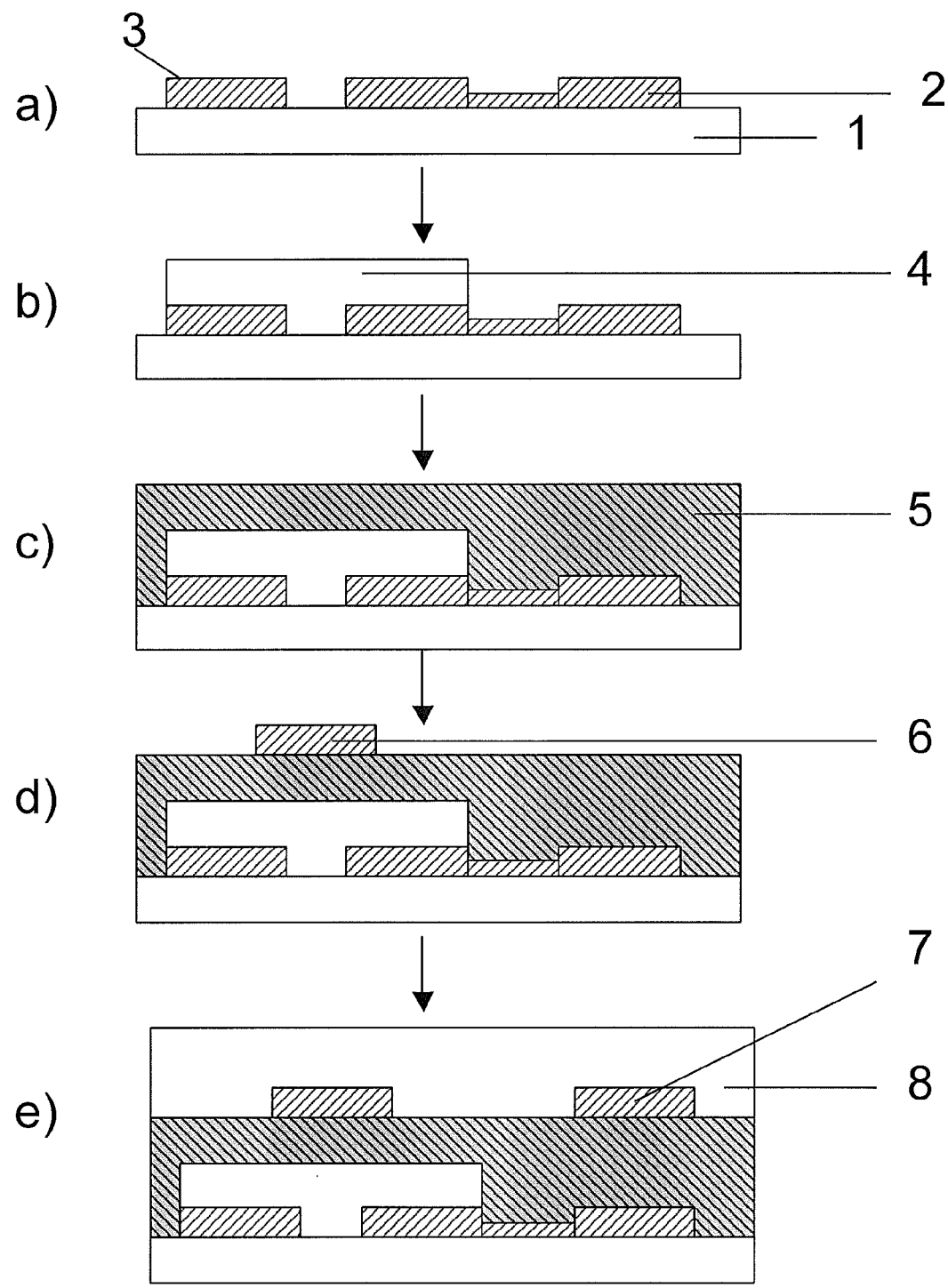
FIG. 1 shows a known method of forming a transistor structure.

With reference to these figures, the multi-layer stack may be deposited as is described above and detailed in FIGS. 1 and 2 up to the deposition of the top pixel electrode. As can be seen from FIG. 2, known transistor array architecture structures are devised such that a top pixel electrode 24 is formed so as to overlap both the COM electrode 7 and the gate electrode 6 of the device being driven.

Figure 5:
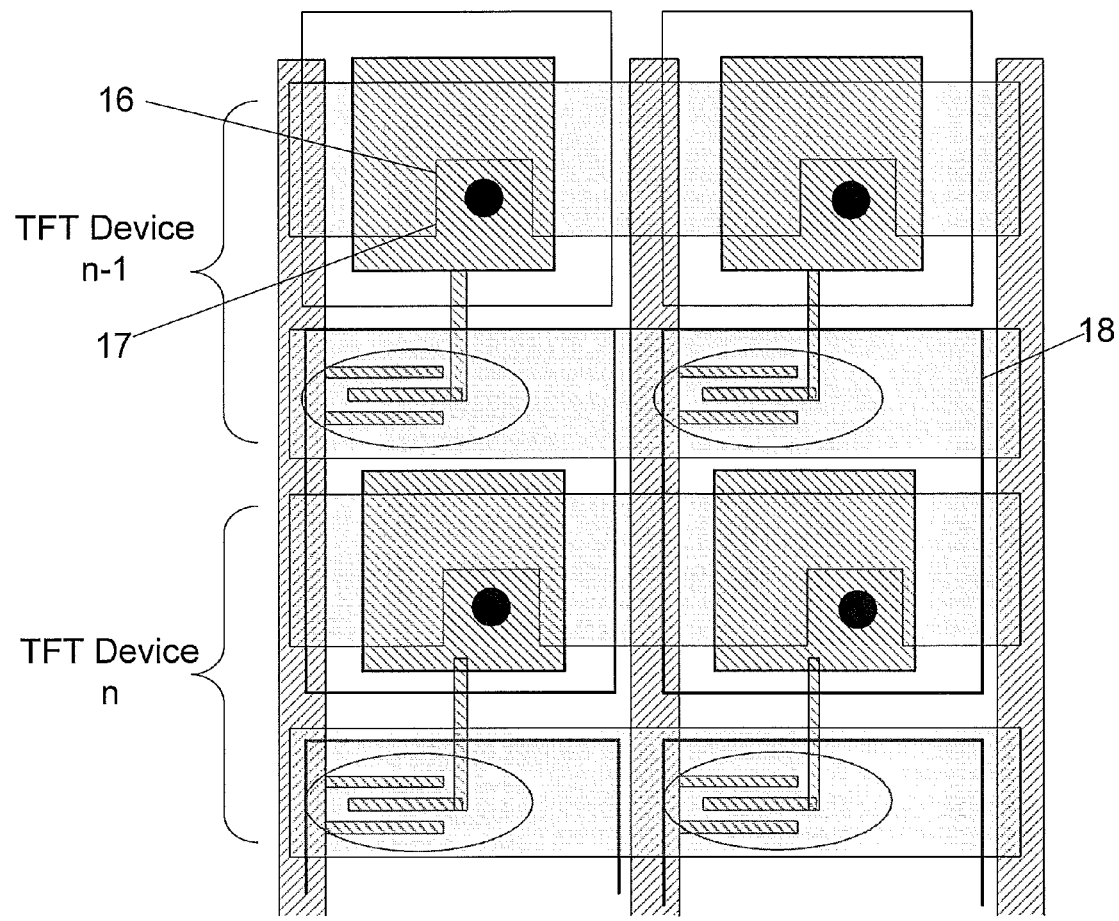
FIG. 5 illustrates a top view schematic of an architecture incorporating pixel drive structures incorporating an embodiment of a multilayer electronic structure including an off-set top pixel electrode according to the invention, wherein the top pixel electrode is horizontally positioned to overlap the left hand source line.

In the present invention, the top pixel electrode is deposited over the multi-layer stack to form a novel configuration, as is illustrated in FIGS. 4 and 5. The present novel architecture design provides a top pixel electrode 12 which overlaps both the COM electrode 7 of the device and the gate electrode 13 of the neighbouring device. A gap is patterned to form adjacent top pixel electrodes, such that this gap may be aligned to the gap between the gate electrode of the present device and COM electrode of the present device, although practically it may be more convenient for the latter gap to be larger, due to display-media related issues. The top pixel electrode then overlaps with the COM electrode of the present device and the gate electrode of the neighbouring device. Such an architecture structure achieves increased storage capacitance ($C_{storage}$), both between the drain & the common electrode as well as between the common electrode & the top pixel electrode. This will also result in the minimisation of the detrimental drain-gate capacitance ($C_{dg}$). Such an advantage is outlined in full below. Therefore the configuration shown in FIG. 4 allows for a reduced dielectric thickness, as considerably no contribution to the parasitic drain-gate capacitance ($C_{dg}$) from the top pixel occurs. Increasing the thickness of the top pixel dielectric and/or decreasing the $C_{storage}$ may improve the ($C_{storage}$)/$C_{dg}$ ratio.

FIG. 4 shows two neighbouring devices of a transistor array. The top pixel electrode has been deposited in an off-set configuration compared to the prior art, which is shown in FIG. 2. FIG. 4 illustrates that in the present invention, the top pixel electrode overlaps with the COM electrode (Cn) 7 of the first device (Device 1) and the gate electrode (Gn+1) 13 of the neighbouring device (Device 2). This novel device array architecture has resulted from a shift in the position of the top pixel electrode in the direction of the neighbouring device. Such a novel configuration is advantageous to the performance of each device, as is described in more detail below.

In order to achieve the above described configuration, it is advantageous for the top pixel electrode to be patterned, as outlined below. The patterning of the top pixel electrode layer forms electrodes and provides an electrical breaks (or gap) in the top pixel electrode between devices within the array. Preferably the top pixel electrode patterning may be achieved by a selective laser ablation patterning technique (SLAP), but other patterning techniques may also be used. Alternative techniques to the SLAP technique to deposit and pattern the top pixel electrode include solution processing techniques such as, but not limited to, spin, dip, blade, bar, slot-die, or spray coating, inkjet, gravure, offset or screen printing. Further, vacuum deposition techniques may be used such as evaporation, or sputtering followed by photolithographic patterning or other subtractive patterning techniques. The preferred SLAP technique is disclosed in our patent application PCT/GB06/050133 the entire content of which is included in the present application by way of reference. SLAP provides a method of producing a pixel electrode which is defined by the isolation of conductive electrode pads on a polymer surface. SLAP allows for patterning by laser ablation of metallic layers on upper layers of a device without radiation induced damage of lower, underlying layers. It uses short pulse lasers for the fabrication of thin film transistor (TFT) structures. This technique incorporating laser ablation uses a single shot per imaging area of a short pulse laser to pattern layers of metallic material on top of underlying layers in order to produce fine features of a TFT device. The distortion compensation with the SLAP technique is achieved by adjusting the relative position of individual exposure areas with respect to each other in order to maintain accurate alignment between the upper layer patterned by the laser with respect to the lower layer pattern defined previously, and by laying out the circuit in such a way that in the overlap areas where multiple exposures occurs no damage is down to functional layers, in particular interconnects (see for example our patent application PCT/GB06/050133).

Within the prior art architecture, it is known that storage capacitance $C_{Storage}$ is obtained from an overlap between the COM electrode and the drain electrode. The effect of an off-set top pixel electrode is an increase in overall storage capacitance caused by an overlap between the top pixel electrode and the COM electrode as well as between the top pixel electrode and the gate ($G_{n-1}$). Further, the parasitic capacitance between the gate electrode and the drain electrode remains unchanged. The parasitic capacitance between the top pixel electrode and the gate electrode, however, decreases. In the present invention where the top pixel electrode is off-set, the storage capacitance ($C_{storage}$) may be increased by lowering the top pixel dielectric thickness. This has the positive effect of increasing the overall $C_{Storage}/C_{Parasitic}$ capacitance ratio, therefore allowing for a good overall pixel capacitance and reduced kickback voltage and variation. The top pixel dielectric layer may therefore be tuned to maximise $C_{storage}$, without increasing $C_{parasitic}$.

EXAMPLE 2

Allowance for Horizontal Movement to Form an Overlap with Either Neighbouring Source Lines ($S_n$ or $S_{n+1}$)

Figure 6:
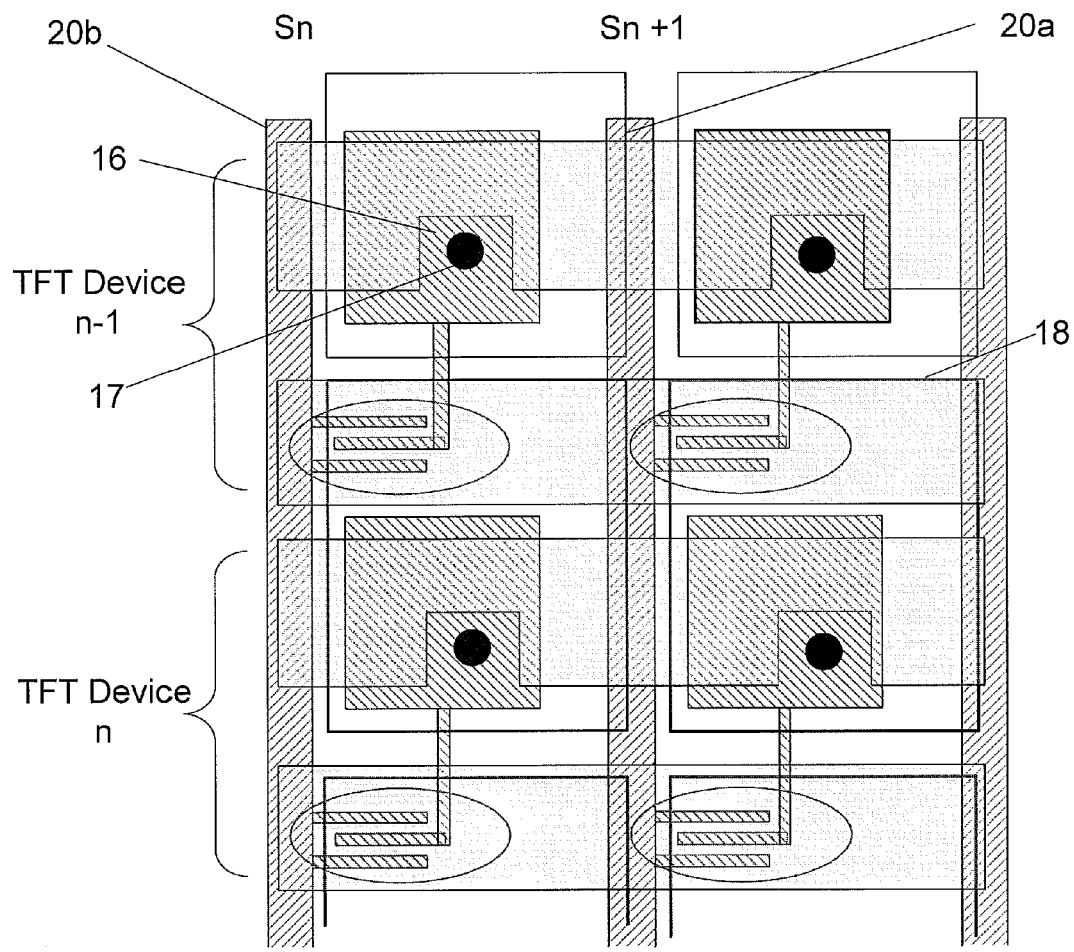
FIG. 6 illustrates a top view schematic of an architecture incorporating pixel drive structures incorporating an embodiment of a multilayer electronic structure including an off-set top pixel electrode, wherein the top pixel electrode is horizontally positioned to overlap the right hand source line.

An embodiment of the present invention provides a thin film transistor device incorporating the aforementioned advantageous architecture (FIGS. 4 and 5), with the advantage described of allowing for further flexibility in the horizontal positioning of the top pixel electrode, as shown in FIG. 6.

FIG. 6 illustrates that a top pixel electrode may be deposited such as either to overlap with either of the neighbouring source lines. For example, for the transistors in the left hand row of FIG. 6, the associated top pixel electrodes overlap with the right hand source line ($S_{n+1}$) 20a. In FIG. 6, the top pixel electrode is shown to overlap with the left hand source line ($S_n$) 20b with the same electrical effect.

This additional flexibility in the positioning of the top pixel electrode, further allows for ease in applying this device architecture and production method to an industrial manufacturing process.

EXAMPLE 3

Offset Pixel Electrode Wherein the Via Hole Interconnect is Positioned Centrally within the Pixel Electrode To further reduce the risk of unreliable reproduction of via hole interconnects from device to device, it is desirable to identify a suitable position for the via hole within the drain pad, that contains the most reproducible characteristics.

Figure 7:
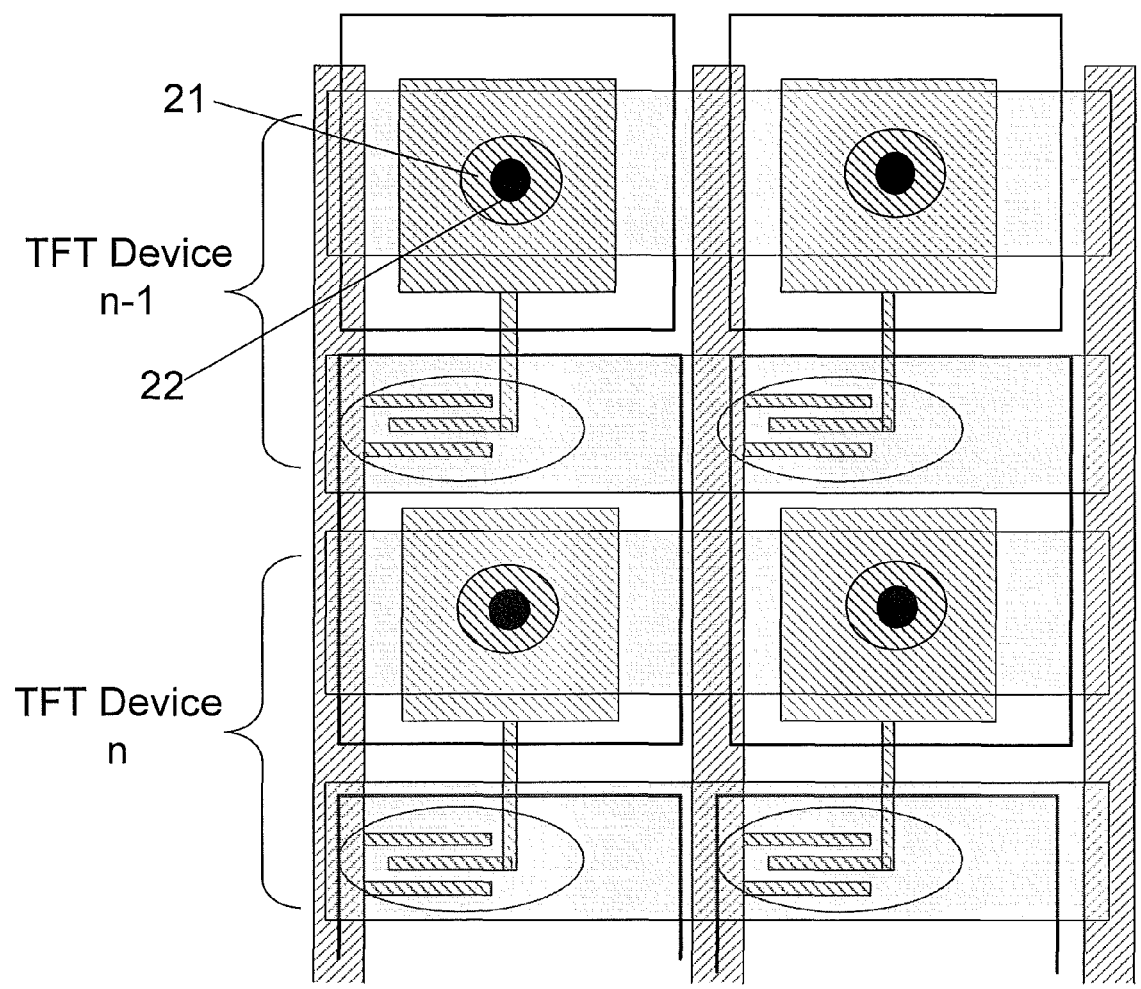
FIG. 7 shows a top view schematic of an architecture incorporating pixel drive structures incorporating an embodiment of a multilayer structure including an off-set top pixel electrode, wherein the top pixel electrode is horizontally positioned to overlap the left hand source line, wherein the via hole is positioned centrally within the drain pad and COM line.

FIG. 7 illustrates a device configuration which incorporates a via hole interconnection at the corner of the drain pad. Formation of the COM line with at least part of the COM line cut away 16 to allow for the via hole formation 17 is desirable. The cut away COM line 16 increases local field strength when charged leading to possible electro-migration issues and field induced dielectric failure issues. Such a configuration carries a risk of both reliability and alignment issues. In particular, ensuring that the via hole interconnect process results in the formation of the via hole interconnect on the drain pad itself can be a challenging task and the chance of forming the via hole interconnect at least partly off of the drain pad is high, with associated yield risks. Therefore positioning the via hole interconnect further towards the middle on the drain pad, away from the edges of the drain pad is preferable to further prevent the risk of the via hole interconnect being positioned (either in part or whole) off of the drain pad. However, this has the added disadvantage that the COM electrode may need to be formed, so that a greater proportion is cut away to allow for the positioning of the via hole interconnect. The COM line may need to be cut away and positioned around the via hole interconnect to ensure that the COM line does not short to the underlying drain pad. However, the greater the portion of the COM line that is cut away or removed from the linear COM line presentation, the greater the reduction in the resultant COM electrode/drain electrode capacitance.

FIG. 7 shows a preferred via hole location on a drain pad. The via hole interconnect 22 is positioned centrally on the drain pad to ensure maximised reliability of positioning the via hole in the targeted position.

In this case, the COM electrode is patterned so as to avoid the position of the pixel via hole, so as to ensure that no electrical shortage results between the drain pad and the COM electrode. In so doing, an approximately circular portion 21 is eliminated form the COM electrode around the via hole interconnect 22 (as seen in FIG. 7).

The present invention is not limited to the foregoing examples. Aspects of the present invention include all novel and/or inventive aspects of the concepts described herein and all novel and/or inventive combinations of the features described herein.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

What is claimed is:

1. A multilayer electronic structure comprising: a substrate bearing at least three conducting layers, adjacent ones of said conducting layers being separated by a dielectric layer, a first one of said conducting layers defining drain and source electrodes of a thin film transistor (TFT) for driving a pixel of an active matrix optoelectronics device, an intermediate second one of said conducting layers defining a gate electrode of said transistor and a first plate of a capacitor for storing charge to maintain an electrical state of said active matrix pixel, and a third one of said conducting layers defining a pixel electrode as a second plate of said capacitor, wherein said pixel electrode is laterally positioned such that it is offset in a vertical direction from said gate electrode and such that it overlaps in a vertical direction with said first plate and at least a gate electrode of a thin film transistor for driving a neighbouring pixel of the active matrix optoelectronics device.

2. An electronic structure as claimed in claim 1 further comprising a via between said second plate and a drain pad coupled to said drain, said via being connected substantially centrally to a surface of said drain pad.

3. An electronic structure as claimed in claim 2 wherein said via is laterally positioned so as to pass through said first plate in a vertical direction.

4. A multilayer electronic structure as claimed in claim 1 wherein a plurality of dielectric layers is provided between said first and second conducting layers.

5. A multilayer electronic structure as claimed in claim 4 wherein a nearer one of the plurality of dielectric layers to an active region of said thin film transistor for driving a pixel has a lower dielectric constant than a farther one of the plurality of dielectric layers.

6. An electronic structure as claimed in claim 1 wherein said thin film transistor comprises an organic semiconductor material.

7. An electronic structure as claimed in claim 6 wherein the electronic structure is adapted to solution deposition.

8. An electronic structure as claimed in claim 1 wherein said substrate comprises a flexible substrate.

9. A pixel drive structure for an active matrix display including the multilayer electronic structure of claim 1 wherein said second plate of said capacitor comprises a pixel drive electrode for driving a pixel of said display.

10. A pixel drive structure as claimed in claim 9 wherein said first plate of said capacitor is connected to a reference potential line or interconnect of said pixel drive structure.

11. An active matrix display comprising a plurality of lines of pixel drive structures as claimed in claim 9, and a plurality of source lines disposed substantially parallel and alternating to said lines of pixel drive structures, wherein said neighbouring pixel is a neighbour in a same one of said lines of pixel drive structures.

12. An active matrix display as claimed in claim 9 wherein second plates of each line of pixel drive structures are positioned such that they planarly overlap with a corresponding adjacent one of the source lines.

13. A method of fabricating a multilayer electronic structure on a substrate, the method comprising:
depositing and patterning a first conducting layer over said substrate to define source and drain electrodes of a thin film transistor for driving a pixel of an active matrix optoelectronics device;
depositing an organic semiconducting layer over said first conducting layer;
depositing a first dielectric layer over said organic semiconducting layer;
depositing and patterning a first portion of a second conducting layer over said first dielectric layer to define a gate electrode of said thin film transistor;
depositing and patterning a second portion of said second conducting layer substantially coplanar to said first portion to define a first plate of a capacitor for storing charge to maintain an electrical state of said active matrix pixel;
depositing a second dielectric layer over said second conducting layer;
depositing and patterning a third conducting layer over said second dielectric layer to define a second plate of said capacitor;
wherein said second plate is laterally positioned such that it is offset in a vertical direction from said gate electrode and such that it overlaps in a vertical direction with said first plate and at least a gate electrode of a thin film transistor for driving a neighbouring pixel of the active matrix optoelectronics device.

14. A method of fabricating a multilayer electronic structure as claimed in claim 13 wherein said depositing and patterning a first conducting layer over said substrate further defines a drain pad coupled to said drain.

15. A method of fabricating a multilayer electronic structure as claimed in claim 14 wherein, prior to depositing and patterning said third conducting layer, the method further comprises forming a via to said drain pad, and wherein said via is formed such that it connects substantially centrally to an upper surface of said drain pad.

16. A method of fabricating a multilayer electronic structure as claimed in claim 13 wherein a plurality of dielectric layers is deposited between said organic semiconducting layer and second conducting layer.

17. A method of fabricating a multilayer electronic structure as claimed in claim 13 wherein a plurality of dielectric layers is deposited between said second and third conducting layers.

18. A method of fabricating a multilayer electronic structure as claimed in claim 16 wherein relative to said organic semiconducting layer, a nearer one of the plurality of dielectric layers has a lower dielectric constant than a farther one of the plurality of dielectric layers.

19. A method of fabricating a multilayer electronic structure as claimed in claim 13 wherein at least some of said deposition and patterning steps employ a solution processing technique.

20. A method of fabricating an active matrix display comprising fabricating a structure for substantially each of a plurality of pixels of said display as claimed in the method of claim 13.

* * * * *

UNITED STATES PATENT AND TRADEMARK OFFICE
CERTIFICATE OF CORRECTION

| | | |
|---|---|---|
| PATENT NO. | : 8,546,807 B2 | Page 1 of 1 |
| APPLICATION NO. | : 12/990198 | |
| DATED | : October 1, 2013 | |
| INVENTOR(S) | : Werne et al. | |

It is certified that error appears in the above-identified patent and that said Letters Patent is hereby corrected as shown below:

On the Title Page (item [30] Foreign Application Priority Data) at line 1, delete "Apr. 28, 2008" and insert --Apr. 29, 2008--.

Signed and Sealed this
Thirteenth Day of May, 2014

Michelle K. Lee
*Deputy Director of the United States Patent and Trademark Office*